US011895893B2

(12) United States Patent
Sun et al.

(10) Patent No.: US 11,895,893 B2
(45) Date of Patent: Feb. 6, 2024

(54) DISPLAY PANEL INCLUDING STACK OF LIGHT-CONVERGING STRUCTURE AND BAND-PASS FILTERING STRUCTURE, MANUFACTURING METHOD THEREOF, AND DISPLAY APPARATUS

(71) Applicant: BOE TECHNOLOGY GROUP CO., LTD., Beijing (CN)

(72) Inventors: Qian Sun, Beijing (CN); Wei Huang, Beijing (CN); Qian Jin, Beijing (CN); Yichi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 331 days.

(21) Appl. No.: 17/354,142

(22) Filed: Jun. 22, 2021

(65) Prior Publication Data

US 2022/0190039 A1 Jun. 16, 2022

(30) Foreign Application Priority Data

Dec. 11, 2020 (CN) ........................ 202011456820.3

(51) Int. Cl.

*H10K 59/38* (2023.01)
*H10K 50/858* (2023.01)
*H10K 71/00* (2023.01)
*H10K 59/12* (2023.01)

(52) U.S. Cl.

CPC ........... *H10K 59/38* (2023.02); *H10K 50/858* (2023.02); *H10K 71/00* (2023.02); *H10K 59/12* (2023.02)

(58) Field of Classification Search

CPC .... H10K 50/856; H10K 50/858; H10K 59/12; H10K 59/38; H10K 2102/331
USPC ........................................................... 257/88
See application file for complete search history.

(56) References Cited

U.S. PATENT DOCUMENTS

2014/0175404 A1* 6/2014 Shim .................... G02B 5/3025 359/483.01
2021/0408128 A1* 12/2021 Peng .................... H10K 50/865
2022/0158135 A1* 5/2022 Irobe .................... H10K 50/858

FOREIGN PATENT DOCUMENTS

JP 2015128027 A * 7/2015 ............. H10K 59/38

* cited by examiner

*Primary Examiner* — Matthew E. Gordon
(74) *Attorney, Agent, or Firm* — HOUTTEMAN LAW LLC

(57) ABSTRACT

The present disclosure provides a display panel including: a first substrate, a light-emitting element array and a color-conversion layer array, the light-emitting element array includes a plurality of light-emitting elements, the color-conversion layer array includes a plurality of color-conversion layers, the light-emitting elements are used for generating and emitting first color light, the color-conversion layers are used for generating other color light under excitation of the first color light, and the display panel further includes a first band-pass filtering layer between the light-emitting element array and the color-conversion layer array and/or a second band-pass filtering layer positioned on one side, away from the light-emitting element array, of the color-conversion layer array.

20 Claims, 9 Drawing Sheets

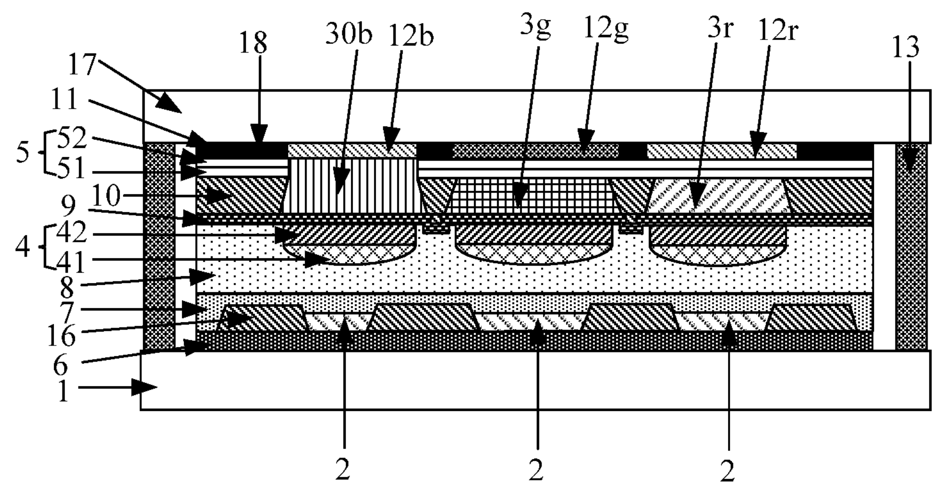
Fig. 6
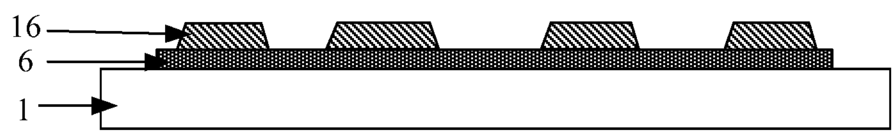
Fig. 7a
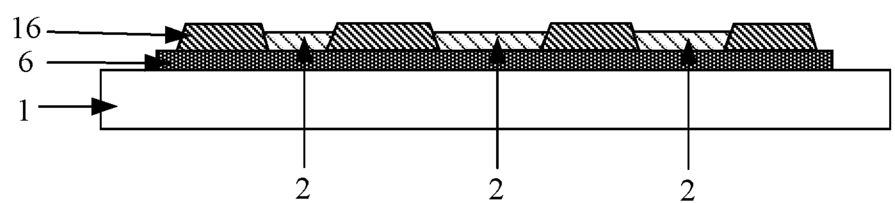
Fig. 7b
16
6
1
2
2
2
Fig. 7c

DISPLAY PANEL INCLUDING STACK OF LIGHT-CONVERGING STRUCTURE AND BAND-PASS FILTERING STRUCTURE, MANUFACTURING METHOD THEREOF, AND DISPLAY APPARATUS

CROSS REFERENCE TO RELATED APPLICATIONS

The present application claims the priority of the Chinese Patent Application No. 202011456820.3 filed on Dec. 11, 2020, the content of which is incorporated herein by reference in its entirety.

TECHNICAL FIELD

The present disclosure relates to the field of display technology, and in particular, to a display panel and a manufacturing method thereof, and a display apparatus.

BACKGROUND

With the continuous development of display technology, people have higher and higher requirements on the display quality of a display apparatus. A color-conversion material is used as a novel luminescent material, and has the advantages of concentrated luminescent spectrum, high color purity, simple adjustment of luminescent color through size, structure or component of the color-conversion material and the like; a color-conversion ink is further cured into a film through solution processing, spin coating or ink jet printing to form a color-conversion layer, and the color-conversion ink is a luminescent material of a new generation applied to a solid state lighting and full color flat panel display.

A display principle of the color-conversion display apparatus is as follows: a light-emitting element generates light and irradiates the light to the color-conversion layer to excite the color-conversion layer to emit light of other color, so that a color display is realized. However, in practical applications, it is found that the light extraction rate of the region of the color-conversion layer in the conventional color-conversion display apparatus (the ratio of the light intensity of the light emitted from the region of the color-conversion layer to the light intensity of the corresponding light-emitting element) is low.

SUMMARY

The present disclosure provides a display panel and a manufacturing method thereof, and a display apparatus.

The display panel includes a first substrate, a light-emitting element array and a color-conversion layer array, wherein the light-emitting element array is located on one side of the first substrate and includes a plurality of light-emitting elements, the color-conversion layer array is located on one side, far away from the first substrate, of the light-emitting element array and includes a plurality of color-conversion layers in one-to-one correspondence with the light-emitting elements, the light-emitting elements are used for generating and emitting first color light, and the corresponding color-conversion layers are used for generating other color lights under the excitation of the first color light, wherein the display panel further includes:

a first band-pass filtering layer located between the light-emitting element array and the color-conversion layer array, including: a first light-converging structure and a first band-pass filtering structure, wherein the first light band-pass filtering structure is positioned on one side, far away from the first substrate, of the first light-converging structure, the first light-converging structure is used for converging light rays, and the first band-pass filtering structure is used for transmitting first color light and reflecting the other color lights; and/or a second band-pass filtering layer located on one side, away from the light-emitting element array, of the color-conversion layer array, including: a second light-converging structure and a second band-pass filtering structure, wherein the second light band-pass filtering structure is positioned on one side, far away from the first substrate, of the second light-converging structure, the second light-converging structure is used for converging light rays, and the second band-pass filtering structure is used for transmitting the other color lights and reflecting the first color light.

In some embodiments, the first light-converging structure includes a plurality of first collimating lenses corresponding to the plurality of light-emitting elements one by one.

In some embodiments, the display panel further includes a first transparent resin layer between the light-emitting element array and the color-conversion layer array, wherein the plurality of first collimating lenses are embedded in the first transparent resin layer.

In some embodiments, the second light-converging structure includes a plurality of second collimating lenses corresponding to the plurality of color-conversion layers one to one.

In some embodiments, the display panel further includes a second transparent resin layer on one side of the color-conversion layer array distal to the light-emitting element array, wherein the plurality of second collimating lenses are embedded in the second transparent resin layer.

In some embodiments, the first light-converging structure includes at least two first light-converging films which are stacked, and a refractive index of one first light-converging film closer to the first substrate among two adjacent first light-converging films is smaller than a refractive index of the other first light-converging film farther from the first substrate among the two adjacent first light-converging films.

In some embodiments, the second light-converging structure includes at least two second light-converging films which are stacked, and a refractive index of one second light-converging film closer to the first substrate among two adjacent second light-converging films is smaller than a refractive index of the other second light-converging film farther from the second substrate among the two adjacent second light-converging films.

In some embodiments, the first band-pass filtering structure is a distributed Bragg reflection structure; and/or the second band-pass filtering structure is a distributed Bragg reflection structure.

In some embodiments, a material of the color-conversion layer includes a quantum dot material.

In some embodiments, the color-conversion layer array includes a first color-conversion layer emitting a second color light and a second color-conversion layer emitting a third color light, the other color lights including the second color light and the third color light; and the first color light is blue light, the second color light is red light, and the third color light is green light.

In some embodiments, the first band-pass filtering structure is configured to have a transmittance of 90% or more for light in a wavelength band of 400 nm to 550 nm and to totally reflect light in a wavelength band of 550 nm to 780 nm.

In some embodiments, the second band-pass filtering structure is configured to have a transmittance of 90% or more for light in a wavelength band of 480 nm to 800 nm and to totally reflect light in a wavelength band of 380 nm to 480 nm.

In some embodiments, the display panel is divided into a plurality of light exiting regions, and the plurality of light exiting regions correspond to the plurality of light-emitting elements one to one; the display panel further includes a first pixel definition layer on one side of the first substrate proximal to the light-emitting element array, and a first encapsulation layer on one side of the first substrate distal to the first pixel definition layer, and the first band-pass filtering layer is between the first encapsulation layer and the color-conversion layer array; and the first pixel definition layer is provided with a plurality of first accommodating openings, the plurality of first accommodating openings correspond to the plurality of light exiting regions one by one, and each of the plurality of light-emitting elements is located in the corresponding first accommodating opening.

In some embodiments, the display panel is divided into a plurality of light exiting regions, the plurality of light exiting regions correspond to the plurality of light-emitting elements one to one, and the plurality of light exiting regions includes a plurality of first light exiting regions for emitting the first color light, a plurality of second light exiting regions for emitting the second color light, and a plurality of third light exiting regions for emitting the third color light; an orthographic projection of the second band-pass filtering layer on the first substrate covers the second light exiting region and the third light exiting region and does not cover the first light exiting region; the display panel further includes a second pixel definition layer on a side of the light-emitting element array distal to the first substrate, wherein the second pixel definition layer is provided with a plurality of second accommodating openings, the plurality of second accommodating openings correspond to the plurality of light exiting regions one to one, the first color-conversion layer and the second color-conversion layer are both located in the corresponding second accommodating openings, and a transparent resin pattern is provided in the second accommodating opening corresponding to the first light exiting region.

In some embodiments, the display panel further includes a second encapsulation layer on one side of the second pixel definition layer proximal to the first substrate, a color filter layer on one side of the second pixel definition layer distal to the first substrate, and a second substrate on one side of the color filter layer distal to the first substrate, and a frame sealing glue between the first substrate and the second substrate in a peripheral region, and the second band-pass filtering layer is between the color filter layer and the second pixel definition layer; and the color filter layer includes a black matrix and a plurality of color filters, the plurality of color filters include a plurality of first color filters, a plurality of second color filters and a plurality of third color filters, wherein the plurality of first color filters are in one-to-one correspondence with the plurality of first light exiting regions, the plurality of second color filters are in one-to-one correspondence with the plurality of second light exiting regions, and the plurality of third color filters are in one-to-one correspondence with the plurality of third light exiting regions.

In some embodiments, the display panel further includes a second encapsulation layer on one side of the second pixel definition layer distal to the first substrate, a color filter layer on one side of the second encapsulation layer distal to the first substrate, a circular polarizer on one side of the color filter layer distal to the first substrate, and a protection film on one side of the circular polarizer distal to the first substrate; wherein the color filter layer includes a black matrix and a plurality of color filters, the plurality of color filters include a plurality of first color filters, a plurality of second color filters and a plurality of third color filters, wherein the plurality of first color filters are in one-to-one correspondence with the plurality of first light exiting regions, the plurality of second color filters are in one-to-one correspondence with the plurality of second light exiting regions, and the plurality of third color filters are in one-to-one correspondence with the plurality of third light exiting regions.

The display apparatus includes the above display panel.

The method of manufacturing a display panel includes: preparing a first display substrate, including: forming a light-emitting element array on a first substrate, wherein the light-emitting element array includes a plurality of light-emitting elements for generating and emitting a first color light; preparing a second display substrate, including: forming a color-conversion layer array on a second substrate, wherein the color-conversion layer array includes a plurality of color-conversion layers which correspond to the plurality of light-emitting elements one by one, and the color-conversion layers are used for generating other color lights under excitation of the first color light; and aligning and assembling the first display substrate and the second display substrate such that the light-emitting element array and the color-conversion layer array are located between the first substrate and the second substrate; wherein the preparing the second display substrate further includes, after the forming the color-conversion layer array, a step of: forming a first band-pass filtering layer on one side of the color-conversion layer array distal to the second substrate, wherein the first band-pass filtering layer includes: a first band-pass filtering structure and a first light-converging structure, the first light-converging structure is arranged on one side of the first band-pass filtering structure distal to the second substrate, the first light-converging structure is used for converging light rays, and the first band-pass filtering structure is used for transmitting the first color light and reflecting the other color lights; and/or wherein the preparing the second display substrate further includes, before the forming the color-conversion layer array, a step of: forming a second band-pass filtering layer on one side of the second substrate on which the color-conversion layer array is subsequently formed such that the second band-pass filtering layer includes a second band-pass filtering structure and a second light-converging structure on one side of the second band-pass filtering structure distal to the second substrate, the second light-converging structure is configured to converge light rays, and the second band-pass filtering structure is configured to transmit the other color lights and reflect the first color light.

The method of manufacturing a display panel includes forming a light-emitting element array on a first substrate such that the light-emitting element array includes a plurality of light-emitting elements for generating and emitting a first color light; forming a color-conversion layer array on one side of the light-emitting element array, distal to the first substrate, wherein the color-conversion layer array includes a plurality of color-conversion layers in one-to-one correspondence with the light-emitting elements, and the plurality of color-conversion layers are used for generating other color lights under excitation of the first color light; between the forming the light-emitting element array and the forming the color-conversion layer array, the method further includes: forming a first band-pass filtering layer on one side of the light-emitting element array distal to the first substrate such that the first band-pass filtering layer includes a first light-converging structure and a first band-pass filtering structure, wherein the first band-pass filtering structure is arranged on one side of the first light-converging structure distal to the first substrate, the first light-converging structure is used for converging light rays, and the first band-pass filtering structure is used for transmitting the first color light and reflecting the other color lights; and/or after the forming the color-conversion layer array, the method further includes forming a second band-pass filtering layer on one side of the color-conversion layer array distal to the first substrate such that the second band-pass filtering layer includes a second light-converging structure and a second band-pass filtering structure, the second light-converging structure is configured to converge light rays, and the second band-pass filtering structure is configured to transmit the other color lights and reflect the first color light.

BRIEF DESCRIPTION OF DRAWINGS

The accompanying drawings, which are included to provide a further understanding of the present disclosure and constitute a part of this specification, are for the purpose of explaining the present disclosure together with the following exemplary embodiments, but are not intended to limit the present disclosure. In the drawings:

FIG. 6 is a schematic diagram of a structure of a display panel according to an embodiment of the disclosure;

FIGS. 7*a* to 7*d* are schematic diagrams illustrating intermediate structures for manufacturing a first display substrate;

DETAIL DESCRIPTION OF EMBODIMENTS

In order to make those skilled in the art better understand the technical solutions of the present disclosure, a display panel, a manufacturing method thereof, and a display device provided in the present disclosure are described in detail below with reference to the accompanying drawings.

The research shows that the low light extraction rate of the region provided with the color-conversion layer in the quantum dot display device in the related art is at least due to the following reasons: first, when the large-angle light emitted by the light-emitting element passes through other functional layers positioned between the light-emitting element and the color-conversion layer, the reflectivity is relatively large, the transmittance is relatively small. That is, relative large light loss exists in the transmission procedure; second, light emitted by the excited color-conversion layer is scattered (360-degree scattered), and a part of light rays cannot be emitted outside from the display panel; and third, the color-conversion efficiency of the color-conversion layer is low. Based on the research, the embodiment of the disclosure provides a technical solution for improving the light extraction rate of the region provided with a color-conversion layer in a quantum dot display device.

Figure 1:
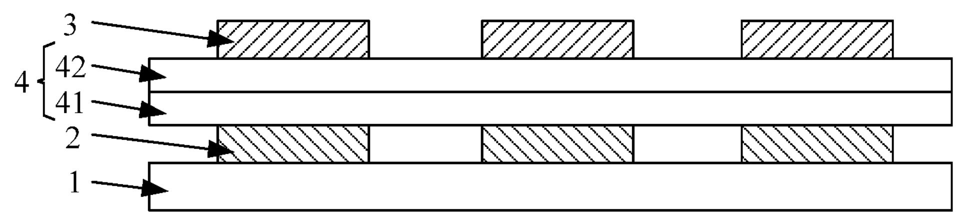
FIG. 1 is a schematic diagram of a structure of a display panel according to an embodiment of the disclosure.

FIG. 1 is a schematic diagram of a structure of a display panel provided in an embodiment of the present disclosure, and as shown in FIG. 1, the display panel is a quantum dot display panel, and includes: a first substrate 1, a light-emitting element array and a color-conversion layer array, the light-emitting element array is located on one side of the first substrate 1 and includes a plurality of light-emitting elements 2, the color-conversion layer array is located on one side, away from the first substrate 1, of the light-emitting element array and includes a plurality of color-conversion layers 3, one color-conversion layer 3 corresponds to one light-emitting element 2, different color-conversion layers 3 correspond to different light-emitting elements 2, the light-emitting elements 2 are used for generating and emitting first color light, and the color-conversion layer 3 is used for generating other color lights under the excitation of the first color light. The wavelength of the first color light is smaller than the wavelengths of the other color lights.

In the embodiment of the present disclosure, the light-emitting element 2 includes an organic light-emitting diode (OLED for short); the organic light-emitting diode includes: an organic functional layer at least including an organic light-emitting layer, and certainly, functional layers such as a hole transport layer, a hole block layer, an electron transport layer and an electron block layer which may be arranged according to actual requirements. In general, each light-emitting element 2 is configured with a corresponding driving circuit including a driving transistor, and the driving circuit is electrically connected to the corresponding light-emitting element 2 to drive the light-emitting element 2 to emit light.

In some embodiments, a material of the light-conversion color layer 3 includes a quantum dot material.

The display panel further includes a first band-pass filtering layer 4 which is located between the light-emitting element array and the color-conversion color layer array, and includes: a first light-converging structure 41 which is configured to converge light and a first band-pass filtering structure 42 which is located on a side of the first light-converging structure 41 away from the first substrate 1, and the first light-converging structure 41 is configured to transmit the first color light and reflect the other color lights.

In the embodiment of the present disclosure, the first color light emitted by the light-emitting element 2 is converged by the first light-converging structure 41 and then enters the first band-pass filtering structure 42 at a small angle (an included angle between the light and a normal of a plane where the first substrate 1 is located), and at this time, most or even all of the first color light may transmit through the first band-pass filtering structure 42 and irradiate to the color-conversion layer 3, so that light loss during light propagation can be reduced; in addition, the light is converged by the first light-converging structure 41, so that the light transmittance effect of the first band-pass filtering structure 42 on the first color light can be further improved, which will be described in detail later. The color-conversion layer 3 is irradiated by the first color light to excite other color light and scatter the other color light, the other color light back to the light exiting side of the display panel (i.e., from the light exiting side of the display panel) is reflected after being irradiated towards the first band-pass filtering structure 42, and the reflected light is emitted outside from the light exiting side of the display panel, so that the amount of light emitted from the region where the color-conversion layer 3 is located can be increased, and the light extraction rate of the region provided with the color-conversion layer 3 is further increased.

Figure 2:
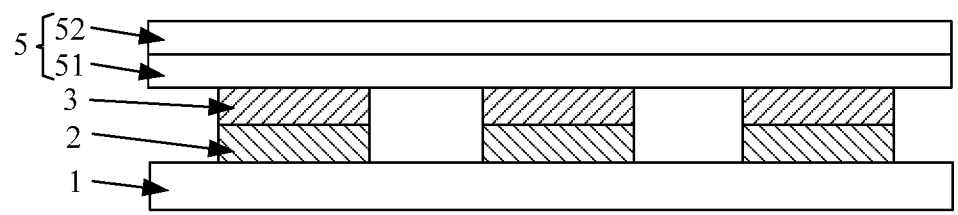
FIG. 2 is a schematic diagram of a structure of a display panel according to an embodiment of the disclosure.

FIG. 2 is a schematic diagram of a structure of a display panel according to an embodiment of the disclosure. As shown in FIG. 2, unlike the display panel shown in FIG. 1, the display panel shown in FIG. 2 does not include the first band-pass filtering layer 4, but includes a second band-pass filtering layer 5. Wherein, the second band-pass filtering layer 5 is located on one side of the color-conversion color layer array far away from the light-emitting element array, and the second band-pass filtering layer 5 includes: a second light-converging structure 51 and a second band-pass filtering structure 52 located on a side of the second light-converging structure 51 far away from the first substrate 1, the second light-converging structure 51 is configured to converge light, and the second band-pass filtering structure 52 is configured to transmit the other color light and reflect the first color light.

In the embodiment of the present disclosure, the other color light emitted by the color-conversion layer 3 enters the second band-pass filtering structure 52 at a small angle after being converged by the second light-converging structure 51, and most or even all of the other color light can penetrate the second band-pass filtering structure 52 and emit to the color-conversion layer 3, so that light loss during light propagation can be reduced; in addition, the second light-converging structure 51 converges light rays, so that the reflection effect of the second band-pass filtering structure 52 on the first color light and the light transmittance effect of the second band-pass filtering structure 52 on the other color light can be improved, as will be described in detail later. Meanwhile, a part of the first color light transmits through the color-conversion layer 3 and irradiates towards the second band-pass filtering layer 5, and the part of the first color light irradiating towards the second band-pass filtering layer 5 is irradiated back towards the color-conversion layer 3 again after being reflected by the second band-pass filtering structure 52, so that the excited color-conversion layer 3 emits the other color light, thereby improving the light conversion rate of the color-conversion layer 3 and further improving the light extraction rate of the region provided with the color-conversion layer 3.

Figure 3:
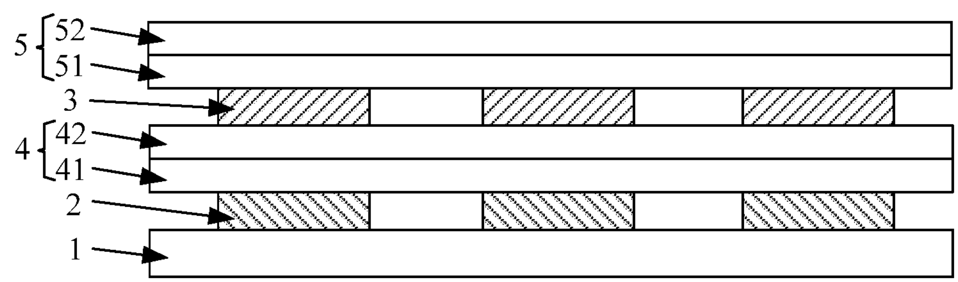
FIG. 3 is a schematic diagram of s structure of a display panel according to an embodiment of the disclosure.

FIG. 3 is a schematic diagram of a structure of a display panel according to an embodiment of the disclosure, and as shown in FIG. 3, the display panel shown in FIG. 3 includes both the first band-pass filtering layer 4 in FIG. 1 and the second band-pass filtering layer 5 in FIG. 2. In the embodiment of the present disclosure, by simultaneously providing the first band-pass filtering layer 4 and the second band-pass filtering layer 5, the light extraction rate of the region provided with the color-conversion layer 3 can be further improved.

Figure 4A:
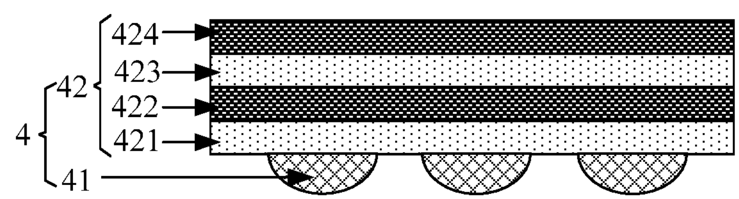
FIG. 4*a* is a schematic diagram of a first band-pass filtering layer according to an embodiment of the present disclosure.

FIG. **4*a* is a schematic diagram of a structure of the first band-pass filtering layer 4 in the embodiment of the present disclosure. As shown in FIG. 4*a*, in some embodiments, the first band-pass filtering structure 42 is a Distributed Bragg Reflector (DBR) structure, that is, the first band-pass filtering structure 42 is a structure formed by alternately stacking thin films 421 and 423 with high refractive index (which may be made of a nano-scale material) and thin films 422 and 424 with low refractive index (which may be made of a nano-scale material), and performs a filtering function through interference of light. When a plurality of high refractive index thin films 421, 423 and low refractive index thin films 422, 424 are included, the refractive indices of different high refractive index thin films 421, 423 may be the same or different, and the refractive indices of different low refractive index thin films 422, 424 may be the same or different, and it is only necessary to ensure that the refractive index of each high refractive index thin film 421, 423 is greater than that of the low refractive index thin film 422, 424 adjacent thereto, and the refractive index of each low refractive index thin film 422, 424 is less than that of the high refractive index thin film 421, 423** adjacent thereto.

The thickness d of each film in the distributed Bragg reflection structure meets the following requirements:

$$d = \frac{\lambda^* q}{4^* n^* \cos\theta},$$

q is a positive integer, λ is the center wavelength of the reflection band (also referred to as the filtering band), and θ is the light incidence angle. Therefore, under the condition that the values of d, q and n are determined, the reflection waveband and the transmission waveband of the distributed Bragg reflection structure can be changed for light rays with different incidence angles. In practical applications, it is found that the reflection band shifts to a short wavelength as the θ angle increases. That is, when the first band-pass filtering structure 42 having the distributed Bragg reflection structure is designed based on the wavelength bands of the other color lights as the reflection wavelength bands, the first band-pass filtering structure 42 reflects the first color light incident at a large angle, so that the overall transmittance of the first color light is reduced. Therefore, in the embodiment of the present disclosure, the first band-pass filtering structure 42 is used in cooperation with the first light-converging structure 41, and the first color light is converged and the first color light emitted to the first band-pass filtering structure 42 is incident light of a small angle, so that the amount of the first color light filtered by the first band-pass filtering structure 42 can be reduced, the light transmittance of the first color light can be improved, and the light extraction rate of the region provided with the color-conversion layer 3 region can be improved.

Figure 4B:
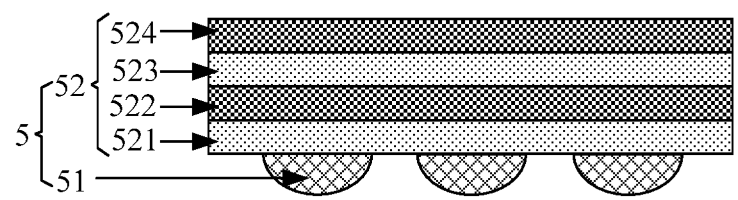
FIG. 4*b* is a schematic diagram of a second band-pass filtering layer according to an embodiment of the disclosure.

FIG. **4*b* is a schematic diagram of a structure of the second band-pass filtering layer 5 in the embodiment of the disclosure, and as shown in FIG. 4*b*, the second band-pass filtering structure 52 has the same structure as the first band-pass filtering structure 42, that is, the second band-pass filtering structure 52 is a structure formed by alternately laminating high refractive index thin films 521 and 523 (which may be made of a nano-scale material) and low refractive index thin films 522 and 524 (which may be made of a nano-scale material). Based on the same principle discussed above, in the embodiment of the present disclosure, the second band-pass filtering structure 52 and the second light-converging structure 51 are used in combination, and the first color light transmitted through the color-conversion layer 3 and the other color light generated by the color-conversion layer 3 are converged to make the first color light and the other color light emitted to the second band-pass filtering structure 52 be incident light with small angles, so that the reflectivity of the second band-pass filtering structure 52 to the first color light and the transmissivity of the second band-pass filtering structure 52 to the other color light can be improved, and the light extraction rate of the region provided with the color-conversion layer 3** can be improved.

It should be noted that, FIGS. 4*a* and 4*b* only exemplarily show the case of four laminated films included in the first band-pass filtering structure 42 and the second band-pass filtering structure 52, and this case is only for exemplary purposes, and does not limit the technical solution of the present disclosure.

With continuous reference to FIG. 4*a*, in some embodiments, the first light-converging structure 41 includes a plurality of first collimating lenses corresponding to the light-emitting elements 2 one to one. In some embodiments, the display panel further includes: a first transparent resin layer 8 (as shown in FIG. 6) located between the light-emitting element array and the color-conversion layer array, wherein the plurality of first collimating lenses are embedded in the first transparent resin layer 8. In some embodiments, the first collimating lens is a plano-convex lens, a convex surface of the plano-convex lens faces the first substrate 1, and a planar surface of the plano-convex lens faces away from the first substrate 1.

With continuous reference to FIG. 4*b*, in some embodiments, the second light-converging structure 51 includes a plurality of second collimating lenses corresponding to the plurality of color-conversion layers 3 one by one. The display panel further includes a second transparent resin layer in which the plurality of second collimating lenses are embedded. In some embodiments, the second collimating lens is a plano-convex lens, a convex surface of which faces the first substrate 1, and a planar surface of which faces away from the first substrate 1.

Figure 5A:
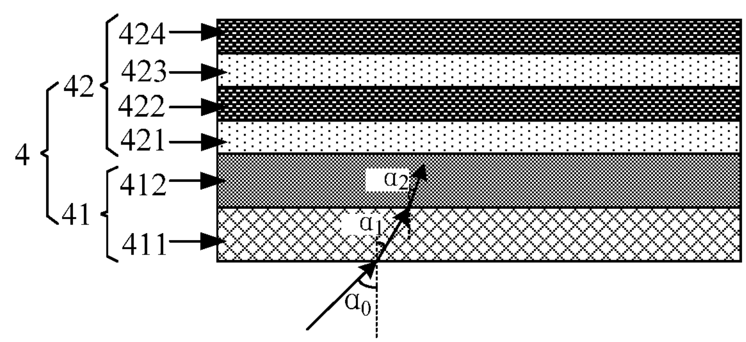
FIG. 5*a* is a schematic diagram of a first band-pass filtering layer according to an embodiment of the present disclosure.

FIG. 5*a* is a schematic diagram of a structure of the first band-pass filtering layer 4 according to the embodiment of the disclosure, and as shown in FIG. 5*a*, unlike the first light-converging structure 41 in the first band-pass filtering layer 4 shown in FIG. 4*a*, which includes the collimating lens, the first light-converging structure 41 in the first band-pass filtering layer 4 shown in FIG. 5*a* includes a thin-film stacked structure. Specifically, the first light-converging structure 41 includes: at least two first light-converging films 411 and 412 which are stacked, and of two adjacent first light-converging films, a refractive index of the first light-converging film 411 closer to the first substrate 1 is smaller than the refractive index of the first light-converging film 412 farther from the first substrate 1. That is, the refractive indices of the first light-converging films 411 and 412 sequentially increase in the direction away from the first substrate 1. When the light is refracted to the optically dense medium from the optically thinner medium, the refraction angle is smaller than the incidence angle under the condition that the incidence angle is larger than 0, so that the light convergence effect is realized.

The first light-converging structure 41 includes two stacked layers of first light-converging films 411 and 412, as shown in FIG. 5*a*, which is exemplary and not intended to limit the technical solution of the present disclosure. Taking the example of the medium refractive index $n_0$=1.5 in contact with the lowermost first light-converging film 411, the refractive index $n_1$=1.78 of the lowermost first light-converging film 411, and the refractive index $n_2$=2.30 of the uppermost first light-converging film 412, for a light ray having an incident angle $\alpha_0$=50°, the refractive angle $\alpha_1$ the light ray after being refracted into the lowermost first light-converging film 411≈40°, and the refractive angle $\alpha_2$ of the light ray after being refracted into the uppermost first light-converging film 411≈30°.

Figure 5B:
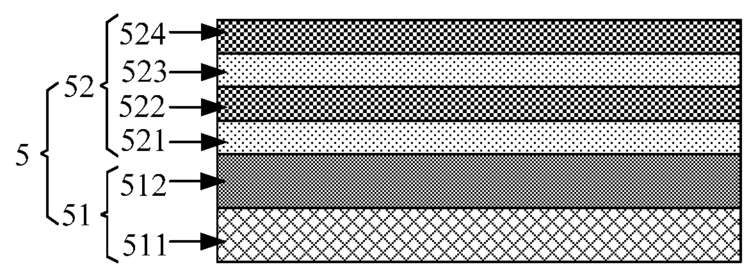
FIG. 5*b* is a schematic diagram of a second band-pass filtering layer according to an embodiment of the disclosure.
Figure 7D:
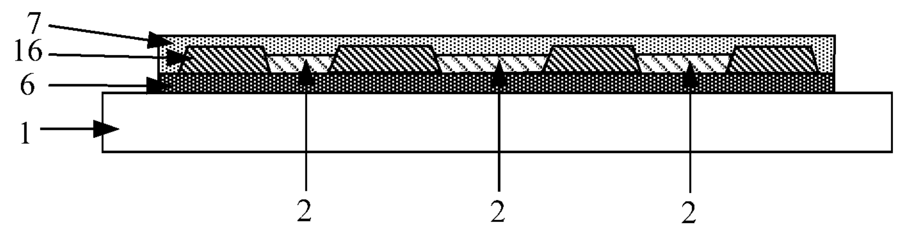

FIG. 5*b* is a schematic diagram of a structure of the second band-pass filtering layer 5 in the embodiment of the present disclosure, and as shown in FIG. 5*b*, similar to the structure of the first light-converging structure 41 in the first band-pass filtering layer 4 shown in FIG. 5*a*, the second light-converging structure 51 in the second band-pass filtering layer 5 shown in FIG. 5*b* includes: at least two second light-converging films 511 and 512 which are stacked, and of two adjacent second light-converging films, the second light-converging film closer to the first substrate 1 has a refractive index smaller than that of the second light-converging film farther from the first substrate 1, and light convergence is achieved by this stacking structure. The second light-converging structure 51 includes two second light-converging films 511 and 512 disposed in a stacked manner in FIG. 5*b*, which is only exemplary and not intended to limit the technical solution of the present disclosure.

FIG. 6 is a schematic diagram of a structure of a display panel provided in an embodiment of the disclosure. As shown in FIG. 6, the display panel shown in FIG. 6 includes both the first band-pass filtering layer 4 and the second band-pass filtering layer 5, and the color-conversion layer array includes: a first color-conversion layer 3 emitting a second color light and a second color-conversion layer 3 emitting a third color light, the other color lights including the second and third color lights.

In some embodiments, the first color light is blue light, the second color light is red light, and the third color light is green light. The first color-conversion layer 3 is a red color-conversion layer 3*r*, the second color-conversion layer 3 is a green color-conversion layer 3*g*, blue light emitted by the light-emitting element 2 excites the red color-conversion layer 3*r* to emit red light, and blue light emitted by the light-emitting element 2 excites the green color-conversion layer 3*g* to emit green light. At this time, the light-emitting element 2 may be a blue organic light-emitting diode.

Further, in some embodiments, the first band-pass filtering structure 42 is configured to have a transmittance of 90% or more for light in a wavelength band of 400 nm to 550 nm and to totally reflect light in a wavelength band of 550 nm to 780 nm. In some embodiments, the second band-pass filtering structure 52 is configured to have a transmittance of 90% or more for light in the wavelength band of 480 nm to 800 nm and to totally reflect light in the wavelength band of 380 nm to 480 nm.

In some embodiments, the display panel is divided into a plurality of light exiting regions, and the light exiting regions correspond to the light-emitting elements 2 one to one; the display panel further includes: a first pixel definition layer 16 located on one side of the first substrate 1 close to the light-emitting element array and a first encapsulating layer 7 located on one side of the first pixel definition layer 16 far away from the first substrate 1, wherein the first band-pass filtering layer 4 is located between the first encapsulating layer 7 and the color-conversion layer array; the first pixel definition layer 16 is provided with a plurality of first accommodating openings, the first accommodating openings correspond to the light exiting regions one by one, and the light-emitting elements 2 are located in the corresponding first accommodating openings.

In some embodiments, the plurality of light exiting regions include: a first light exiting region for emitting a first color light, a second light exiting region for emitting a second color light, and a third light exiting region for emitting a third color light; namely, the first light exiting region, the second light exiting region and the third light exiting region are a blue light exiting region, a red light exiting region and a green light exiting region, respectively. An orthographic projection of the second band-pass filtering layer 5 on the first substrate 1 covers the second light exiting region and the third light exiting region and does not cover the first light exiting region; the display panel further includes: a second pixel definition layer 10 located on a side of the light-emitting element array away from the first substrate 1, wherein a plurality of second accommodating openings are defined in the second pixel definition layer 10, the second accommodating openings correspond to the light exiting regions one to one, the first color-conversion layer 3 and the second color-conversion layer 3 are both located in the corresponding second accommodating openings, and a transparent resin pattern 30*b* is disposed in the second accommodating opening corresponding to the first light exiting region.

In some embodiments, the display panel further includes a second encapsulation layer 9 positioned on one side, close to the first substrate 1, of the second pixel definition layer 10, a color filter layer 11 positioned on one side, far away from the first substrate 1, of the second pixel definition layer 10, a second substrate 17 positioned on one side, far away from the first substrate 1, of the color filter layer 11, and a frame sealing glue 13 positioned between the first substrate 1 and the second substrate 17 and positioned in a peripheral region, and the second band-pass filtering layer 5 is arranged between the color filter layer 11 and the second pixel definition layer 10;

The color filter layer 11 includes a black matrix 18 and a plurality of color filters which include first color filters, second color filters and third color filters, wherein the first color filters correspond to the first light exiting regions one by one, the second color filters correspond to the second light exiting regions one by one, and the third color filters correspond to the third light exiting regions one by one. That is, the first color filter is a blue color filter 12*b*, the second color filter is a red color filter 12*r*, and the third color filter is a green color filter 12*g*.

The display panel shown in FIG. 6 is a display panel by aligning and assembling for example a first display substrate and a second display substrate. The first display substrate includes: a first substrate 1, a driving layer 6, a first pixel definition layer 16, a light-emitting element array and a first encapsulation layer 7; the second display substrate includes: a second substrate 17, a color filter layer 11, a second band-pass filtering layer 5, a second pixel definition layer 10, a color-conversion layer array, a second encapsulation layer 9 and a first band-pass filtering layer 4. The first display substrate and the second display substrate can be fixed through the first transparent resin layer 8, and the frame sealing glue 13 is arranged between the first substrate 1 and the second substrate 17 and in the peripheral region for sealing.

FIGS. 7*a* to 7*d* are schematic diagrams illustrating intermediate structures obtained during preparing the first display substrate, and as shown in FIGS. 7*a* to 7*d*, the first display substrate is prepared as follows: first, a first substrate 1 is provided, and the first substrate 1 may be a rigid glass substrate or a flexible resin substrate. Then, referring to FIG. 7*a*, a driving layer 6 is prepared on the first substrate 1 by a Thin Film Transistor (TFT) Array (Array) process, and the driving layer 6 includes a driving circuit with thin film transistors (including a driving transistor), the thin film transistor can be an Oxide thin film transistor or a Low Temperature Poly-silicon (LTPS) thin film transistor, and the Thin Film Transistor (TFT) Array (Array) process belongs to the conventional technology in the field, and the detailed description is omitted here. Then, referring to FIG. 7*b*, a first pixel definition layer 16 is prepared, where the first pixel definition layer 16 may be made of a transparent resin material or a colored resin material. For example, the first pixel definition layer 16 may be made of a colored resin material or a black resin material, the first pixel definition layer 16 defines a plurality of first accommodating openings, and the first accommodating openings correspond to the light exiting regions one to one; in some embodiments, the size of the first accommodating opening corresponding to the green light exiting region (the cross-sectional area of the accommodating opening on the light exiting side) is greater than or equal to the size of the first accommodating opening corresponding to the red light exiting region, and the size of the first accommodating opening corresponding to the red light exiting region is greater than or equal to the size of the first accommodating opening corresponding to the blue light exiting region. Then, referring to FIG. 7*c*, a light-emitting element is prepared in the first accommodating opening, taking the light-emitting element as a blue organic light-emitting diode as an example, an anode of the blue organic light-emitting diode and a drain of the driving transistor share the same layer, and at this time, only an organic functional layer and a cathode capable of emitting blue light need to be prepared in the first accommodating opening; in some embodiments, the anode of the organic light-emitting diode is made of a metal material (e.g., molybdenum, aluminum, etc.) such that the anode serves as a reflective electrode, and the cathode is made of a transparent conductive material (e.g., indium tin oxide, indium gallium zinc oxide, etc.); in some embodiments, an overall thickness of the driving layer 6 and the organic light-emitting diode is 3 μm to 4 μm. Finally, referring to FIG. 7*d*, a first encapsulation layer 7 is prepared, wherein the first encapsulation layer 7 is a laminated structure formed by alternately arranging inorganic encapsulation films and organic encapsulation films, and the first encapsulation layer 7 is exemplarily a three-layer laminated structure of an inorganic encapsulation film-an organic encapsulation film-an inorganic encapsulation film; the inorganic encapsulation film can be obtained by depositing silicon oxide and/or silicon nitride by Chemical Vapor Deposition (CVD), and a thickness thereof is generally 1 μm; the organic encapsulation film can be obtained by Ink Jet printing OW for short) an organic material, a thickness thereof is generally 6-8 μm, and the organic encapsulation film can also play a role in flattening.

Figure 8A:
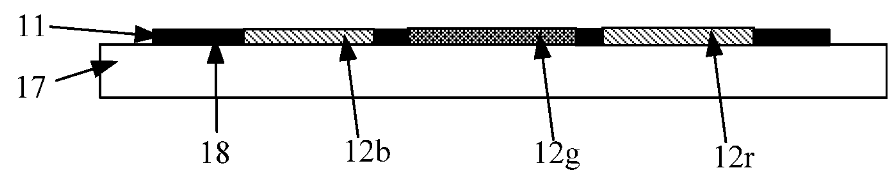
FIGS. 8*a* to 8*f* are schematic diagrams illustrating intermediate structures for manufacturing a second display substrate.
Figure 8B:
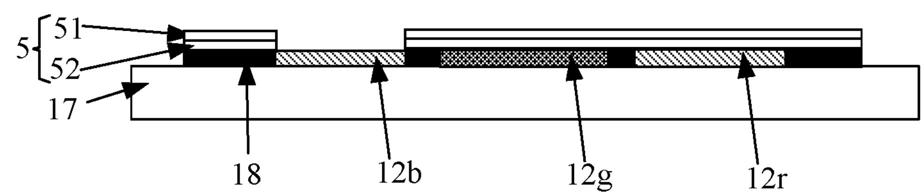
Figure 8C:
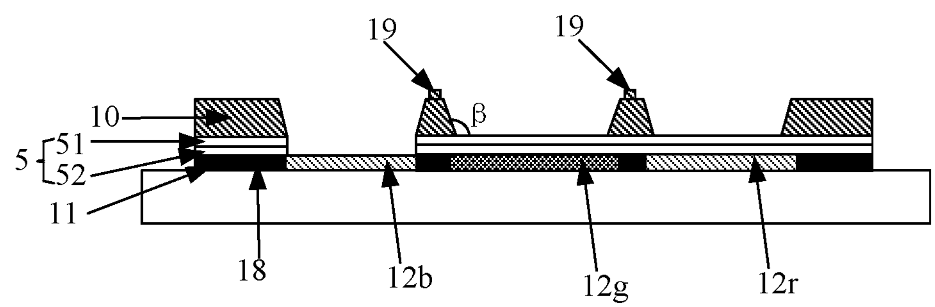
Figure 8D:
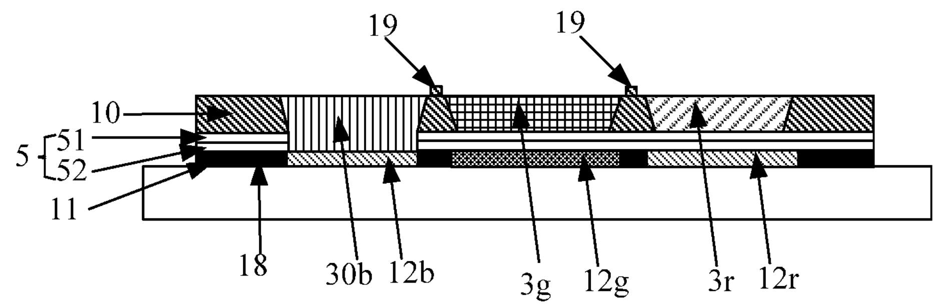
Figure 8E:
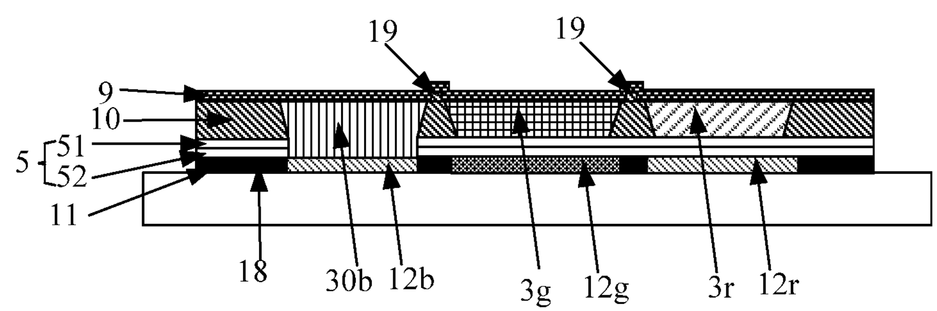
Figure 8F:
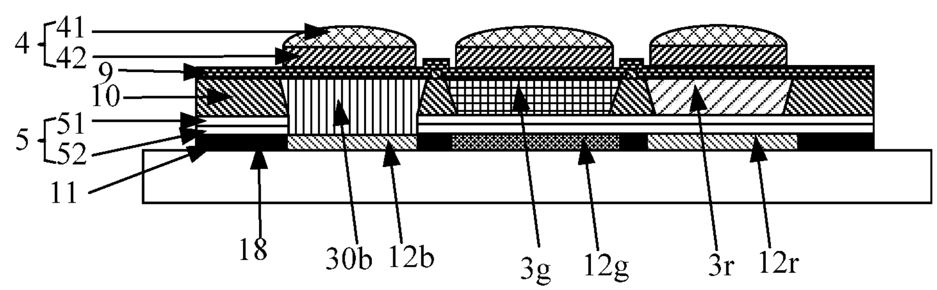

FIGS. 8*a* to 8*f* are schematic diagrams illustrating intermediate structures during preparing the second display substrate, and as shown in FIGS. 8*a* to 8*f*, the second display substrate is manufactured as follows: first, a second substrate 17 is provided, and the second substrate 17 may be a rigid glass substrate or a flexible resin substrate. Then, as shown in FIG. 8*a*, a color filter layer 11 is prepared on the second substrate base 17; specifically, the black matrix 18 is prepared first, and a thickness thereof is less than or equal to 2 μm; various color filters with a thickness less than or equal to 3 μm are respectively formed; in some embodiments, the color filters include: a blue color filter 12*b*, a red color filter 12*r*, and a green color filter 12 *g*. Then, referring to FIG. 8*b*, a second band-pass filtering layer 5 is prepared; specifically, a nanometer-scale high-refractive-index resin material and a nanometer-scale low-refractive-index resin material are alternately deposited by Plasma Enhanced Chemical Vapor Deposition (PECVD) to form a second band-pass filtering structure 52, and then a second light-converging structure 51 is prepared; in the embodiment of the present disclosure, a plurality of second collimating lenses (e.g., plano-convex lenses) may be prepared by exposure and development to prepare the second light-converging structure 51, or a plurality of second light-converging films may be prepared in a stacked manner to prepare the second light-converging structure 51, and the refractive indices of the second light-converging films decrease in sequence in the direction away from the second substrate 17; the second band-pass filtering layer 5 completely covers the red light exiting region and the green light exiting region, but does not cover the blue light exiting region. It should be noted that, when the second light-condensing structure 51 includes a plurality of second collimating lenses, in order to ensure preparation reliability of following layers, a second transparent resin layer is formed above the second collimating lenses for planarization, and the second collimating lenses are embedded in the second transparent resin layer. Next, referring to FIG. 8*c*, a second pixel definition layer 10 is prepared, wherein a plurality of second accommodating openings are arranged in the second pixel definition layer 10, and the second accommodating openings correspond to the light exiting regions one to one; in some embodiments, a dihedral angle β formed by a sidewall portion and a bottom plane of the second accommodating opening for enclosing the second accommodating opening of the second pixel definition layer 10 is in a range of 80° to 120°, for example, 90° to 110°, and the thickness of the second pixel definition layer 10 is in a range of 6 μm to 12 μm. In some embodiments, the size of the second accommodating opening corresponding to the green light exiting region (the cross-sectional area of the second accommodating opening on the light exiting side) is greater than or equal to the size of the second accommodating opening corresponding to the red light exiting region, and the size of the second accommodating opening corresponding to the red light exiting region is greater than or equal to the size of the second accommodating opening corresponding to the blue light exiting region. In addition, some isolation dams 19 may be further disposed above the second pixel defining layer 10 that encloses the second accommodating opening corresponding to the red light exiting region and the second accommodating opening corresponding to the green light exiting region, so as to prevent the green quantum dot material and the red quantum dot material from being mixed when the green color-conversion layer 3*g* and the red color-conversion layer 3*r* are subsequently formed. In addition, a light reflecting metal layer (not shown) may be further disposed on the sidewall enclosing the second accommodating opening to increase the amount of the emitted light. Next, as shown in FIG. 8*d*, a red color-conversion layer 3*r* and a green color-conversion layer 3*g* are respectively formed in the second accommodating opening corresponding to the red light exiting region and the second accommodating opening corresponding to the green light exiting region, and a transparent resin pattern 30*b* is formed in the second accommodating opening corresponding to the blue light exiting region; scattering particles are doped in the color-conversion layer 3 and the transparent resin pattern 30*b*, so that consistent viewing angles of the light exiting regions are ensured. The thicknesses of the color-conversion layer 3 and the transparent resin pattern 30*b* are 6 μm to 12 μm and are similar to the thickness of the second pixel definition layer 10, and the curing temperatures of the resin material in the color-conversion layer 3 and the resin material in the transparent resin pattern 30*b* are less than or equal to 180° C. Next, as shown in FIG. 8*e*, a second encapsulation layer 9 is prepared; in some embodiments, the second encapsulation layer 9 has a refractive index in the range of 1.7 to 2.0, such as 1.75 to 1.85; the thickness of the second encapsulation layer 9 is less than 1 μm, for example less than 0.5 μm. Finally, referring to FIG. 8*f*, a first band-pass filtering layer 4 is prepared; specifically, a nano-scale high-refractive-index resin material and a nano-scale low-refractive-index resin material are alternately deposited through a plasma enhanced chemical vapor deposition to form a first band-pass filtering structure 42; then, a first light-converging structure 41 is prepared; in the embodiment of the present disclosure, a plurality of first collimating lenses (e.g., plano-convex lenses) may be prepared by exposure and development to obtain the first light-converging structures 41, or a plurality of first light-converging films may be prepared in a stacked manner, and in a direction away from the first substrate 1, the refractive indices of the first light-converging films decrease sequentially to obtain the first light-converging structures 41; the first band-pass filtering layer 4 completely covers the red light exiting region, the green light exiting region and the blue light exiting region.

The aligning and assembling process of the first display substrate and the second display substrate is as follows: first, coating a frame sealing glue 13 on the peripheral region of the first display substrate and/or the second display substrate and coating a first transparent resin material in the middle region of the first display substrate and/or the second display substrate in a vacuum or nitrogen environment; then, after the two substrates are close to each other, high-precision alignment is carried out and assemble is realized; then, the frame sealing glue 13 is cured by an ultraviolet curing process, and the first transparent resin material is thermally cured by a low-temperature (less than or equal to 100° C.) curing process. The thickness of the frame sealing glue 13 is 15 μm to 50 μm, for example, 20 μm to 40 μm, or 20 μm to 30 μm; the frame sealing glue 13 contains a filler of fiber or microsphere for controlling particle size and thickness. The first transparent resin material can be low-temperature curing resin (the main curing temperature is less than or equal to 100° C., for example, less than or equal to 90° C.), the gas overflowing value (outgas) of the cured first transparent resin material is less than or equal to 100 ppm after being baked for 2 hours at 100° C., the first transparent resin material forms the first transparent resin layer 8 after being cured, and the thickness of the first transparent resin layer 8 ranges from Sum to 30 μm, for example, from 10 μm to 15 μm. In addition, in order to avoid total reflection of a part of light at the interface between adjacent films, the refractive index of the first transparent resin layer 8 may be smaller than or equal to the refractive index of the film in the first light-converging structure 41, which is in contact with the first transparent resin layer 8, and the refractive index of the first transparent resin layer may be larger than or equal to the refractive index of the film in the first encapsulation layer 7, which is in contact with the first transparent resin layer 8.

Illustratively, the refractive index of the layer in the first light-converging structure 41, which is in contact with the first transparent resin layer 8, is n3, and the refractive index of the film in the first encapsulation layer 7, which is in contact with the first transparent resin layer 8, is n4, then the refractive index n5 of the first transparent resin layer 8 satisfies: n4≤n5≤n3, and the specific value can be set according to actual conditions.

It should be noted that, when the first band-pass filtering layer 4 is present in the display panel and the first light-converging structure 41 in the first band-pass filtering layer 4 includes the first collimating lens, the first collimating lens is embedded in the first transparent resin layer 8.

Figure 9:
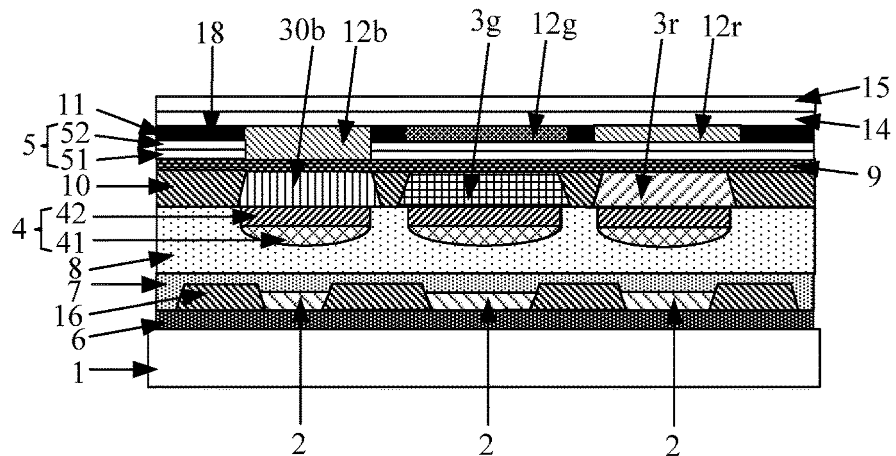
FIG. 9 is a schematic diagram of a structure of a display panel according to an embodiment of the disclosure.

FIG. 9 is a schematic diagram of a structure of a display panel provided in an embodiment of the disclosure. As shown in FIG. 9, unlike the display panel of assemble of two display substrates shown in FIG. 6, the display panel shown in FIG. 9 is a different display panel from the display panel of assemble of two display substrates; specifically, the color-conversion layer array is directly formed on the first display substrate. At this time, the second encapsulation layer 9 is located on the side of the second pixel definition layer 10 away from the first substrate 1, the second band-pass filtering layer 5 is located on the side of the second encapsulation layer 9 away from the first substrate 1, and the color filter layer 11 is located on the side of the second band-pass filtering layer 5 away from the first substrate 1.

In practical applications, it is found that in a display panel using the blue light-emitting element 2 plus the red/green color-conversion layers 3*r* and 3*g*, the amount of blue light emitted from the display panel is large, which tends to cause the overall display screen to be blue. In order to solve the problem, a circular polarizer 14 and a protection film 15 are further disposed on the side of the color filter layer 11 away from the first substrate 1, and the protection film 15 is located on the side of the circular polarizer 14 away from the first substrate 1. The circular polarizer 14 is a reflective circular polarizer 14, such as a reflective circular polarizer 14 with a slightly higher reflectivity in the blue wavelength band, to reduce the blue component in the outgoing light. The protection film 15 includes a scratch-resistance coating material having a high transmittance, and plays a role in protecting the circular polarizer 14.

Figure 10A:
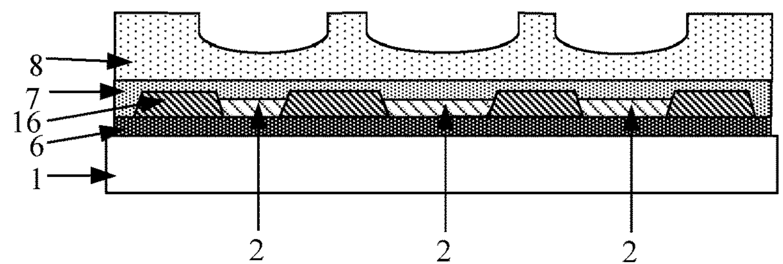
FIGS. 10*a* to 10*g* are schematic diagrams illustrating that other functional layers are directly formed on the first display substrate according to an embodiment of the disclosure.
Figure 10B:
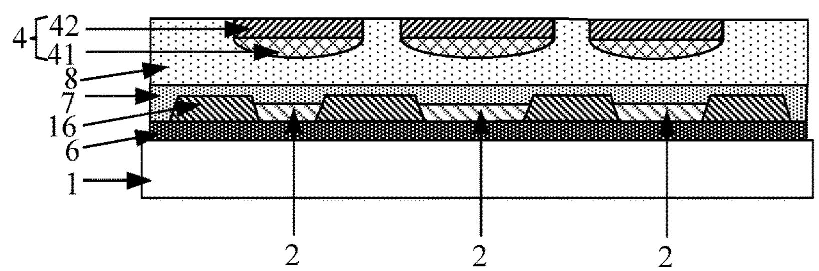
Figure 10C:
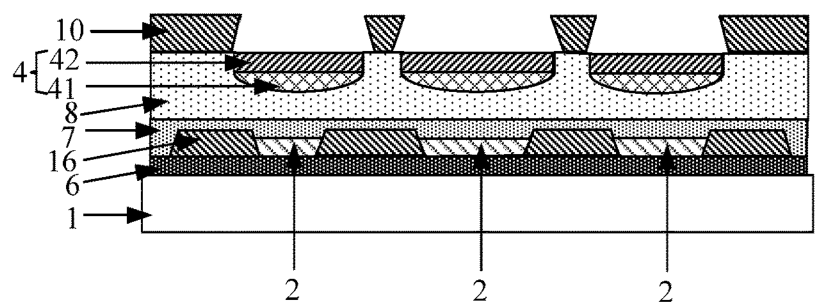
Figure 10D:
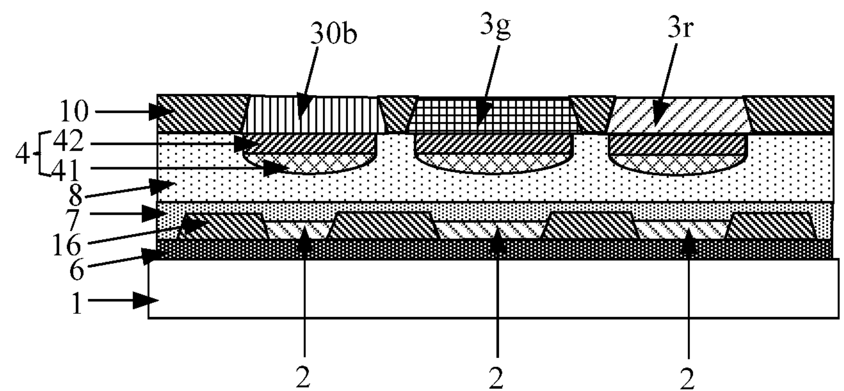
Figure 10E:
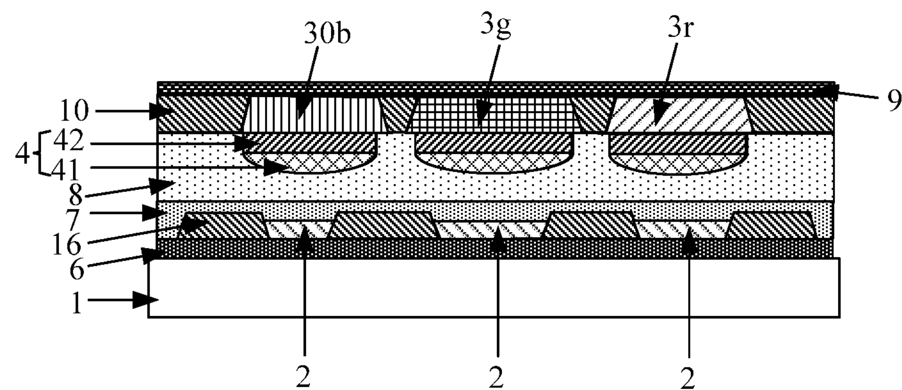
Figure 10F:
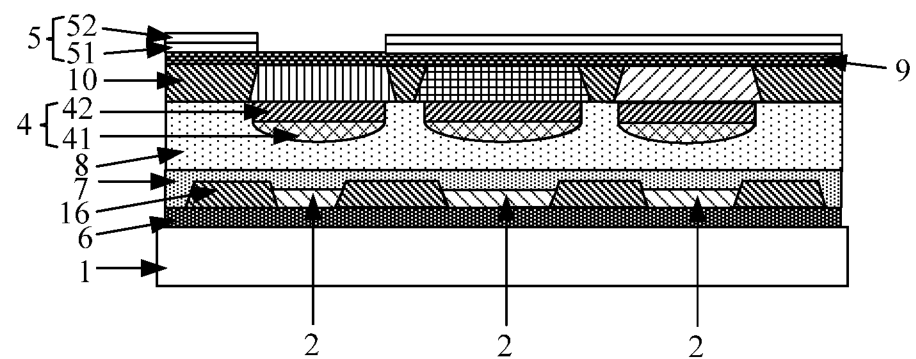
Figure 10G:
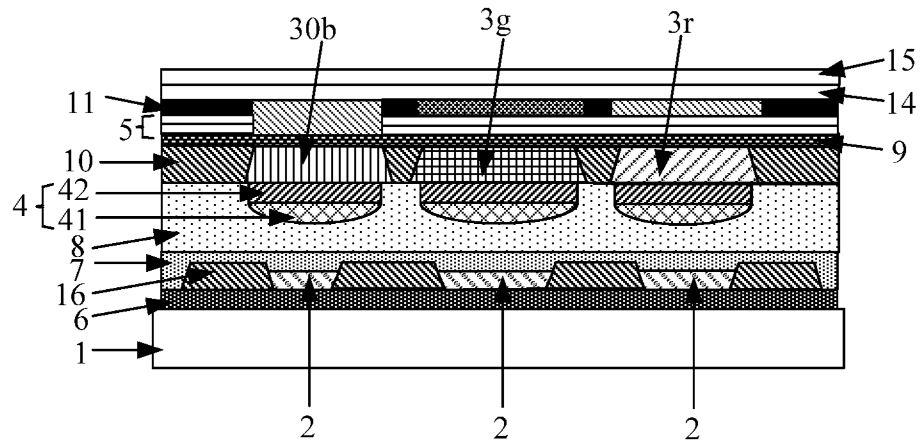

FIGS. 10*a* to 10*g* are schematic diagrams illustrating structures formed during directly preparing other functional layers on the first display substrate in an embodiment of the disclosure. As shown in FIGS. 10*a* to 10*g*, in the embodiment of the disclosure, a process of directly preparing other functional layers on the first display substrate is as follows: first, a first display substrate is provided, which can be referred to the above contents, and is not described herein again. Then, referring to FIG. 10*a*, a first transparent resin layer 8 is prepared on the first display substrate; in order to avoid total reflection of a part of light at the interface between adjacent films, the refractive index of the first transparent resin layer 8 is less than or equal to that of a film in the first light-converging structure 41 which is prepared subsequently and is in contact with the first transparent resin layer 8, and the refractive index of the first transparent resin layer is greater than or equal to that of a film in the first encapsulation layer 7 which is in contact with the first transparent resin layer 8; when the first light-converging structure 41 in the first band-pass filtering layer 4 to be subsequently prepared includes the first collimating lenses, accommodating grooves for accommodating the first collimating lenses are formed on the side of the first transparent resin layer 8 distal to the first substrate through exposure (e.g., half-tone mask exposure) development. For example, if the first collimating lens is a plano-convex lens, the bottom of the accommodating groove is a convex surface; when the first light-condensing structure 41 in the first band-pass filtering layer 4 to be prepared subsequently includes first light-converting films which are laminated, the accommodating groove does not need to be prepared. Then, referring to FIG. 10*b*, a first band-pass filtering layer 4 is prepared; specifically, a first light-converging structure 41 is prepared first, and then a first band-pass filtering structure 42 is prepared; in the embodiment of the present disclosure, a plurality of first collimating lenses (e.g., plano-convex lenses) can be prepared by exposure and development to obtain the first light-converging structure 41, where the first collimating lenses are located in the accommodating grooves of the first transparent resin layer 8; or preparing a plurality of first light-converging films which are stacked, wherein the refractive indices of the first light-converging films are sequentially increased in the direction away from the first substrate 1 to prepare the first light-converging structure 41; the first band-pass filtering structure 42 can be formed by alternately depositing a nano-scale high-refractive-index resin material and a nano-scale low-refractive-index resin material by plasma enhanced chemical vapor deposition, and the first band-pass filtering structure 42 may also be located in the accommodating groove (at this time, the maximum thickness of the first transparent resin layer 8 is greater than or equal to the maximum thickness of the first band-pass filtering structure 42); in some embodiments, a surface of the first band-pass filtering structure 42 away from the first substrate 1 is flush with a surface of the first transparent resin layer 8 away from the first substrate 1, so as to facilitate preparation of a subsequent layer; the first band-pass filtering layer 4 completely covers the red light exiting region, the green light exiting region and the blue light exiting region. Next, referring to FIG. 10*c*, the second pixel definition layer 10 is prepared, which is referred to the above, and is not described herein again. Next, referring to FIG. 10*d*, a red color-conversion layer 3*r* and a green color-conversion layer 3*g* are respectively formed in the second accommodation opening corresponding to the red light exit region and the second accommodation opening corresponding to the green light exit region, and a transparent resin pattern 30*b* is formed in the second accommodation opening corresponding to the blue light exit region. Next, referring to FIG. 10*e*, a second encapsulation layer 9 is prepared; the refractive index of the second encapsulation layer 9 ranges from 1.7 to 2.0, such as from 1.75 to 1.85; the thickness of the second encapsulation layer 9 is less than 1 μm, for example less than 0.5 μm. Next, referring to FIG. 10*f*, a second band-pass filtering layer 5 is prepared; specifically, the second light-converging structure 51 is prepared first, and then the second band-pass filtering structure 52 is prepared, which are the same as those for the first light-converging structure 41 and the first band-pass filtering structure 42, and can refer to the foregoing contents and are not described herein again; the second band-pass filtering layer 5 completely covers the red light exiting region and the green light exiting region, but does not cover the blue light exiting region. Next, as shown in FIG. 10*g*, the color filter layer 11, the circular polarizer 14, and the protection film 15 are sequentially prepared.

Based on the same inventive concept, embodiments of the present disclosure further provide a display apparatus, where the display apparatus is a quantum dot display apparatus, and the display apparatus includes the display panel provided in any one of the foregoing embodiments, and for the description of the display panel, reference may be made to the contents of the foregoing embodiments, and details are not repeated here.

Based on the same inventive concept, the embodiment of the present disclosure further provides a method for manufacturing a display panel, which can be used for manufacturing the display panel provided in the previous embodiment.

Figure 11:
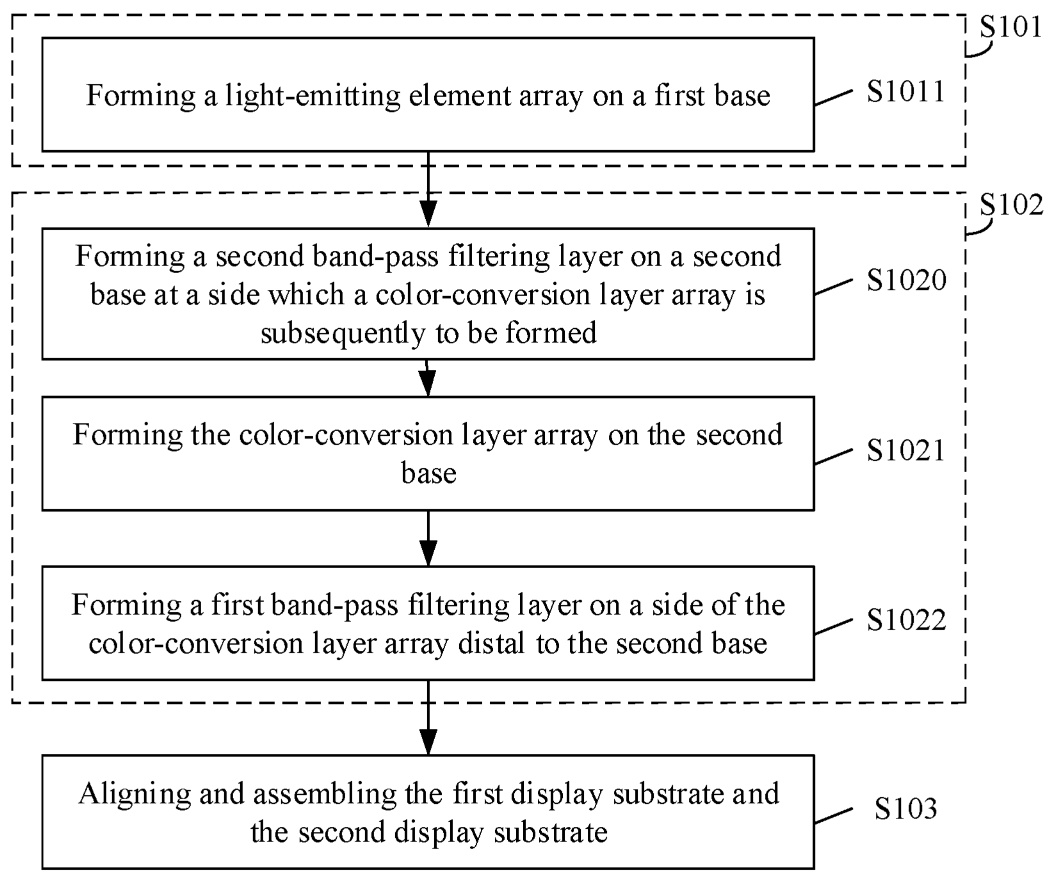
FIG. 11 is a flowchart of a method for manufacturing a display panel according to an embodiment of the present disclosure.

FIG. 11 is a flowchart of a method for manufacturing a display panel according to an embodiment of the present disclosure. As shown in FIG. 11, the method includes:

Step S101, preparing a first display substrate.

Step S101 includes step S1011.

Step S1011, forming a light-emitting element array on the first substrate.

The light-emitting element array includes a plurality of light-emitting elements, and the light-emitting elements are used for generating and emitting light of a first color.

Step S102, preparing a second display substrate.

Step S102 includes step S1021.

Step S1021, forming a color-conversion layer array on the second substrate.

The color-conversion layer array includes a plurality of color-conversion layers, one color-conversion layer corresponds to one light-emitting element, different color-conversion layers correspond to different light-emitting elements, and the color-conversion layers are used for generating other color lights under the excitation of the first color light.

In some embodiments, after step S1021, the step S102 further includes step S1022.

In step S1022, a first band-pass filtering layer is formed on a side of the color-conversion layer array away from the second substrate.

The first band-pass filtering layer includes a first light-converging structure and a first band-pass filtering structure, wherein the first light band-pass filtering structure is positioned on one side, far away from the first substrate, of the first light-converging structure, the first light-converging structure is used for converging light rays, and the first band-pass filtering structure is used for transmitting first color light and reflecting the other color lights.

In some embodiments, before step S1021, the step S102 further includes step S1020.

Step S1020: forming a second band-pass filtering layer on the second substrate on a side that the color-conversion layer array is subsequently to be formed.

The second band-pass filtering layer includes a second band-pass filtering structure and a second light-converging structure, the second light-converging structure is located on one side, far away from the second substrate, of the second band-pass filtering structure, the second light-converging structure is configured to converge light rays, and the second band-pass filtering structure is configured to transmit the other color lights and reflect the first color light.

The technical solution of the present disclosure does not limit the order of step S101 and step S102. That is, the step S102 may be executed before the step S101, or executed after the step S101, or executed simultaneously with the step S101.

Step S103, aligning and assembling the first display substrate and the second display substrate.

The light-emitting element array and the color-conversion layer array are positioned between the first substrate and the second substrate.

In the embodiment of the present disclosure, it is sufficient that the step S102 includes at least one of the step S1020 and the step S1021, and in the figure, the case where the step S102 includes the step S1020 to the step S2022 is only exemplary, and does not limit the technical solution of the present disclosure. For the detailed description of the above steps, reference may be made to the corresponding contents in the foregoing embodiments, which are not described herein again.

Figure 12:
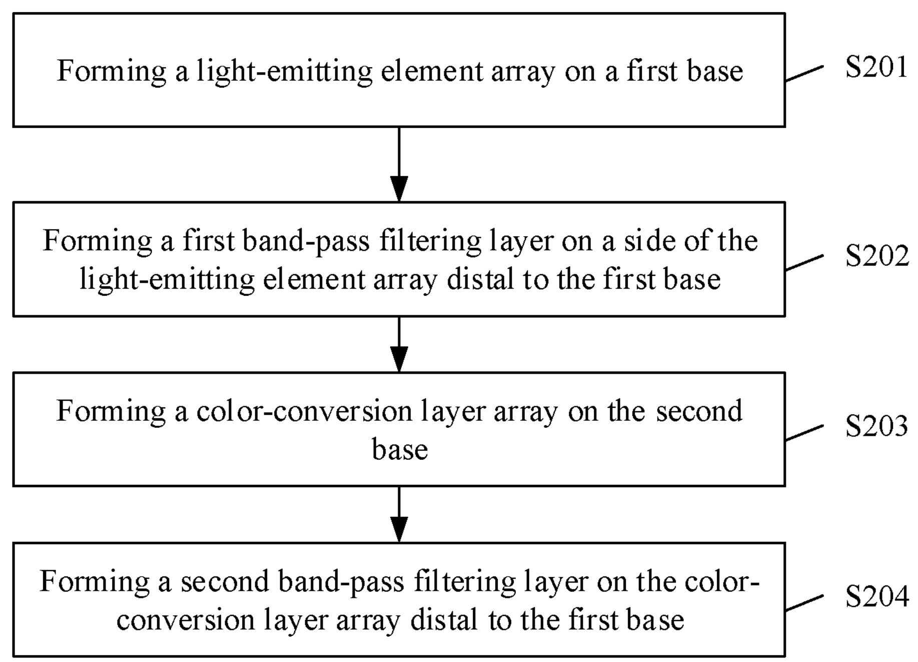
FIG. 12 is a flowchart of a method for manufacturing a display panel according to an embodiment of the present disclosure.

FIG. 12 is a flowchart of a method for manufacturing a display panel according to an embodiment of the disclosure. As shown in FIG. 12, the method includes:

Step S201, forming a light-emitting element array on the first substrate.

The light-emitting element array includes a plurality of light-emitting elements, and the light-emitting elements are used for generating and emitting first color light.

Step S203 is to form a color-conversion layer array on a side of the light-emitting element array away from the first substrate.

The color-conversion layer array includes a plurality of color-conversion layers, one color-conversion layer corresponds to one light-emitting element, different color-conversion layers correspond to different light-emitting elements, and the color-conversion layers are used for generating other color lights under the excitation of the first color light.

In some embodiments, step S202 is further included between the step S201 and the step S203.

Step S202, forming a first band-pass filtering layer on a side of the light-emitting element array away from the first substrate.

Wherein the first band-pass filtering layer includes a first light-converging structure and a first band-pass filtering structure, wherein the first light band-pass filtering structure is positioned on one side, far away from the first substrate, of the first light-converging structure, the first light-converging structure is used for converging light rays, and the first band-pass filtering structure is used for transmitting first color light and reflecting the other color lights.

In some embodiments, step S204 is also included after step S203.

Step S204, forming a second band-pass filtering layer on a side of the color-conversion array away from the first substrate.

Wherein the second band-pass filtering layer includes a second light-converging structure and a second band-pass filtering structure on one side, far away from the first substrate, of the second light-converging structure, the second light-converging structure is configured to converge light, and the second band-pass filtering structure is configured to transmit other color lights and reflect the first color light.

In the embodiment of the present disclosure, the method may include at least one of the step S202 and the step S204, and the case of including the step S202 to the step S204 in the figure at the same time is only exemplary, which does not limit the technical solution of the present disclosure. For the detailed description of the above steps, reference may be made to the corresponding contents in the foregoing embodiments, which are not described herein again.

It should be understood that, the above embodiments are merely exemplary embodiments employed to illustrate the principles of the present disclosure, and the present disclosure is not limited thereto. It will be apparent to a person skilled in the art that various changes and modifications can be made therein without departing from the spirit and scope of the disclosure, and these changes and modifications are to be considered within the scope of the disclosure.

What is claimed is:

1. A display panel, comprising:

a first substrate, a light-emitting element array and a color-conversion layer array, wherein the light-emitting element array is arranged on one side of the first substrate and comprises a plurality of light-emitting elements, the color-conversion layer array is located on a side of the light-emitting element array distal to the first substrate, and comprises a plurality of color-conversion layers in one-to-one correspondence with the plurality of light-emitting elements, the light-emitting elements are configured to generate and emit first color light, and the corresponding plurality of color-conversion layers are configured to generate other color lights under excitation of the first color light, wherein the display panel further comprises:

a first band-pass filtering layer located between the light-emitting element array and the color-conversion layer array, comprising: a first light-converging structure in contact with a first band-pass filtering structure, wherein the first light band-pass filtering structure is located on a side of the first light-converging structure distal to the first substrate, the first light-converging structure is configured to converge light rays, and the first band-pass filtering structure is configured to transmit first color light and reflect the other color lights; and/or a second band-pass filtering layer located on a side of the color-conversion layer array, distal to the light-emitting element array, comprising: a second light-converging structure and a second band-pass filtering structure, wherein the second light band-pass filtering structure is located on a side of the second light-converging structure distal to the first substrate, the second light-converging structure is configured to converge light rays, and the second band-pass filtering structure is configured to transmit the other color lights and reflect the first color light.

2. The display panel of claim 1, wherein the first light-converging structure comprises a plurality of first collimating lenses corresponding to the plurality of light-emitting elements one by one.

3. The display panel of claim 2, further comprising a first transparent resin layer between the light-emitting element array and the color-conversion layer array, wherein the plurality of first collimating lenses are embedded in the first transparent resin layer.

4. The display panel of claim 1, wherein the second light-converging structure comprises a plurality of second collimating lenses corresponding to the plurality of color-conversion layers one to one.

5. The display panel of claim 4, further comprising a second transparent resin layer on one side of the color-conversion layer array distal to the light-emitting element array, wherein the plurality of second collimating lenses are embedded in the second transparent resin layer.

6. The display panel of claim 1, wherein the first light-converging structure comprises at least two first light-converging films which are stacked, and a refractive index of one first light-converging film closer to the first substrate among two adjacent first light-converging films is smaller than a refractive index of the other first light-converging film farther from the first substrate among the two adjacent first light-converging films.

7. The display panel of claim 1, wherein the second light-converging structure comprises at least two second light-converging films which are stacked, and a refractive index of one second light-converging film closer to the first substrate among two adjacent second light-converging films is smaller than a refractive index of the other second light-converging film farther from the second substrate among the two adjacent second light-converging films.

8. The display panel of claim 1, wherein the first band-pass filtering structure is a distributed Bragg reflection structure; and/or the second band-pass filtering structure is a distributed Bragg reflection structure.

9. The display panel of claim 1, wherein a material of the color-conversion layer comprises a quantum dot material.

10. The display panel of claim 1, wherein the color-conversion layer array comprises a first color-conversion layer emitting a second color light and a second color-conversion layer emitting a third color light, the other color lights comprising the second color light and the third color light; and the first color light is blue light, the second color light is red light, and the third color light is green light.

11. The display panel of claim 10, wherein the first band-pass filtering structure is configured to have a transmittance of 90% or more for light in a wavelength band of 400 nm to 550 nm and to totally reflect light in a wavelength band of 550 nm to 780 nm.

12. The display panel of claim 10, wherein the second band-pass filtering structure is configured to have a transmittance of 90% or more for light in a wavelength band of 480 nm to 800 nm and to totally reflect light in a wavelength band of 380 nm to 480 nm.

13. The display panel of claim 10, wherein the display panel is divided into a plurality of light exiting regions, and the plurality of light exiting regions correspond to the plurality of light-emitting elements one to one;

the display panel further comprises a first pixel definition layer on one side of the first substrate proximal to the light-emitting element array, and a first encapsulation layer on one side of the first substrate distal to the first pixel definition layer, and the first band-pass filtering layer is between the first encapsulation layer and the color-conversion layer array; and the first pixel definition layer is provided with a plurality of first accommodating openings, the plurality of first accommodating openings correspond to the plurality of light exiting regions one by one, and each of the plurality of light-emitting elements is located in the corresponding first accommodating opening.

14. The display panel of claim 10, wherein the display panel is divided into a plurality of light exiting regions, the plurality of light exiting regions correspond to the plurality of light-emitting elements one to one, and the plurality of light exiting regions comprise a plurality of first light exiting regions for emitting the first color light, a plurality of second light exiting regions for emitting the second color light, and a plurality of third light exiting regions for emitting the third color light;

an orthographic projection of the second band-pass filtering layer on the first substrate covers the second light exiting region and the third light exiting region and does not cover the first light exiting region;

the display panel further comprises a second pixel definition layer on a side of the light-emitting element array distal to the first substrate, wherein the second pixel definition layer is provided with a plurality of second accommodating openings, the plurality of second accommodating openings correspond to the plurality of light exiting regions one to one, the first color-conversion layer and the second color-conversion layer are both located in the corresponding second accommodating openings, and a transparent resin pattern is provided in the second accommodating opening corresponding to the first light exiting region.

15. The display panel of claim 14, wherein the display panel further comprises a second encapsulation layer on one side of the second pixel definition layer proximal to the first substrate, a color filter layer on one side of the second pixel definition layer distal to the first substrate, and a second substrate on one side of the color filter layer distal to the first substrate, and a frame sealing glue between the first substrate and the second substrate in a peripheral region, and the second band-pass filtering layer is between the color filter layer and the second pixel definition layer; and the color filter layer comprises a black matrix and a plurality of color filters, the plurality of color filters comprise a plurality of first color filters, a plurality of second color filters and a plurality of third color filters, wherein the plurality of first color filters are in one-to-one correspondence with the plurality of first light exiting regions, the plurality of second color filters are in one-to-one correspondence with the plurality of second light exiting regions, and the plurality of third color filters are in one-to-one correspondence with the plurality of third light exiting regions.

16. The display panel of claim 14, further comprising a second encapsulation layer on one side of the second pixel definition layer distal to the first substrate, a color filter layer on one side of the second encapsulation layer distal to the first substrate, a circular polarizer on one side of the color filter layer distal to the first substrate, and a protection film on one side of the circular polarizer distal to the first substrate;

wherein the color filter layer comprises a black matrix and a plurality of color filters, the plurality of color filters comprise a plurality of first color filters, a plurality of second color filters and a plurality of third color filters, wherein the plurality of first color filters are in one-to-one correspondence with the plurality of first light exiting regions, the plurality of second color filters are in one-to-one correspondence with the plurality of second light exiting regions, and the plurality of third color filters are in one-to-one correspondence with the plurality of third light exiting regions.

17. A display apparatus, comprising the display panel of claim 1.

18. A method of manufacturing a display panel, comprising:

preparing a first display substrate, which comprises forming a light-emitting element array on a first substrate, wherein the light-emitting element array comprises a plurality of light-emitting elements for generating and emitting a first color light; preparing a second display substrate, which comprises forming a color-conversion layer array on a second substrate, wherein the color-conversion layer array comprises a plurality of color-conversion layers which correspond to the plurality of light-emitting elements one by one, and the plurality of color-conversion layers are configured to generate other color lights under excitation of the first color light; and aligning and assembling the first display substrate and the second display substrate such that the light-emitting element array and the color-conversion layer array are located between the first substrate and the second substrate; wherein the preparing the second display substrate further comprises, after the forming the color-conversion layer array, a step of: forming a first band-pass filtering layer on one side of the color-conversion layer array distal to the second substrate, wherein the first band-pass filtering layer comprises: a first band-pass filtering structure in contact with a first light-converging structure, the first light-converging structure is arranged on one side of the first band-pass filtering structure distal to the second substrate, the first light-converging structure is configured to converge light rays, and the first band-pass filtering structure is configured to transmit the first color light and reflect the other color lights; and/or wherein the preparing the second display substrate further comprises, before the forming the color-conversion layer array, a step of: forming a second band-pass filtering layer on one side of the second substrate on which the color-conversion layer array is subsequently formed such that the second band-pass filtering layer comprises a second band-pass filtering structure and a second light-converging structure on one side of the second band-pass filtering structure distal to the second substrate, the second light-converging structure is configured to converge light rays, and the second band-pass filtering structure is configured to transmit the other color lights and reflect the first color light.

19. A method of manufacturing a display panel, comprising:

forming a light-emitting element array on a first substrate such that the light-emitting element array comprises a plurality of light-emitting elements for generating and emitting a first color light; forming a color-conversion layer array on one side of the light-emitting element array, distal to the first substrate, wherein the color-conversion layer array comprises a plurality of color-conversion layers in one-to-one correspondence with the plurality of light-emitting elements, and the plurality of color-conversion layers are configured to generate other color lights under excitation of the first color light; between the forming the light-emitting element array and the forming the color-conversion layer array, the method further comprises:

forming a first band-pass filtering layer on one side of the light-emitting element array distal to the first substrate such that the first band-pass filtering layer comprises a first light-converging structure in contact with a first band-pass filtering structure, wherein the first band-pass filtering structure is arranged on one side of the first light-converging structure distal to the first substrate, the first light-converging structure is configured to converge light rays, and the first band-pass filtering structure is configured to transmit the first color light and reflect the other color lights; and/or after the forming the color-conversion layer array, the method further comprises forming a second band-pass filtering layer on one side of the color-conversion layer array distal to the first substrate such that the second band-pass filtering layer comprises a second light-converging structure and a second band-pass filtering structure, the second light-converging structure is configured to converge light rays, and the second band-pass filtering structure is configured to transmit the other color lights and reflect the first color light.

20. The method of claim 19, wherein the first light-converging structure comprises a plurality of first collimating lenses corresponding to the plurality of light-emitting elements one by one.

* * * * *